(12) United States Patent
Kaibe et al.

(10) Patent No.: US 10,193,046 B2
(45) Date of Patent: Jan. 29, 2019

(54) THERMOELECTRIC GENERATING DEVICE AND THERMOELECTRIC GENERATING METHOD

(71) Applicant: KELK LTD., Hiratsuka-shi (JP)

(72) Inventors: Hiromasa Kaibe, Kawasaki (JP); Hirokuni Hachiuma, Hiratsuka (JP)

(73) Assignee: Kelk Ltd., Hiratsuka-shi, Kanagawa (JP)

( * ) Notice: Subject to any disclaimer, the term of this patent is extended or adjusted under 35 U.S.C. 154(b) by 124 days.

(21) Appl. No.: 15/112,551

(22) PCT Filed: Feb. 23, 2015

(86) PCT No.: PCT/JP2015/054993
§ 371 (c)(1),
(2) Date: Jul. 19, 2016

(87) PCT Pub. No.: WO2015/146411
PCT Pub. Date: Oct. 1, 2015

(65) Prior Publication Data
US 2017/0125657 A1    May 4, 2017

(30) Foreign Application Priority Data
Mar. 26, 2014  (JP) .................................. 2014-064654

(51) Int. Cl.
*H01L 35/10* (2006.01)
*H02M 7/48* (2007.01)
(Continued)

(52) U.S. Cl.
CPC ................ *H01L 35/10* (2013.01); *G01K 7/02* (2013.01); *H01L 35/32* (2013.01); *H02M 3/155* (2013.01); *H02M 7/48* (2013.01); *H02M 7/537* (2013.01)

(58) Field of Classification Search
CPC ........... H01L 35/10; H01L 35/32; G01K 7/02; H02M 3/155; H02M 7/537
See application file for complete search history.

(56) References Cited

U.S. PATENT DOCUMENTS 4,467,611 A * 8/1984 Nelson .................... H01L 35/00
  62/3.3
5,705,770 A * 1/1998 Ogasawara ............... H02J 7/34
  136/205

(Continued)

FOREIGN PATENT DOCUMENTS

CN           1890878 A     1/2007
CN         102195535 A     9/2011
(Continued)

OTHER PUBLICATIONS

International Search Report dated May 26, 2015, issued for PCT/JP2015/054993.

*Primary Examiner* — Lisa Caputo
*Assistant Examiner* — Philip Cotey
(74) *Attorney, Agent, or Firm* — Locke Lord LLP; Daniel J. Fiorello

(57) ABSTRACT

A thermoelectric generating device includes: a thermoelectric generating element configured to convert thermal energy to electric energy and to output the electric energy; a temperature measuring unit configured to measure hot side temperature of the thermoelectric generating element; and a temperature controller configured to perform control to increase an amount of current returning to the thermoelectric generating element when the hot side temperature becomes higher than predetermined temperature.

9 Claims, 8 Drawing Sheets

(51) Int. Cl.
*G01K 7/02* (2006.01)
*H01L 35/32* (2006.01)
*H02M 3/155* (2006.01)
*H02M 7/537* (2006.01)

(56) References Cited

U.S. PATENT DOCUMENTS

| | | | |
|---|---|---|---|
| 6,232,543 B1 | 5/2001 | Nagata | |
| 7,508,671 B2 | 3/2009 | Sauciuc et al. | |
| 2004/0134200 A1* | 7/2004 | Schroeder | F25B 21/02 62/3.7 |
| 2005/0078451 A1 | 4/2005 | Sauciuc et al. | |
| 2005/0178425 A1* | 8/2005 | Itoh | F01N 5/025 136/205 |
| 2007/0096564 A1 | 5/2007 | Maeda | |
| 2010/0146991 A1* | 6/2010 | Ilercil | F25B 21/02 62/3.3 |
| 2011/0128698 A1* | 6/2011 | Nishioka | G06F 1/203 361/679.46 |
| 2012/0305045 A1 | 12/2012 | Kamping | |
| 2012/0312030 A1* | 12/2012 | Lu | F25B 21/02 62/3.6 |
| 2013/0062945 A1* | 3/2013 | Balogh | H02J 1/108 307/43 |
| 2013/0265023 A1* | 10/2013 | Schwartz | H02M 3/33515 323/282 |
| 2017/0125657 A1 | 4/2017 | Kaibe et al. | |

FOREIGN PATENT DOCUMENTS

| | | |
|---|---|---|
| CN | 103208736 A | 7/2013 |
| JP | 52165273 U | 12/1977 |
| JP | 63-245285 A | 10/1988 |
| JP | 06-022572 A | 1/1994 |
| JP | 2000-125578 A | 4/2000 |
| JP | 2002354785 A | 12/2002 |
| JP | 2004245530 A | 9/2004 |
| JP | 2005287090 A | 10/2005 |
| JP | 2007-005371 A | 1/2007 |
| JP | 2007-012768 A | 1/2007 |
| JP | 2007-159310 A | 6/2007 |
| JP | 2009232511 A | 10/2009 |
| JP | 2010-010637 A | 1/2010 |
| JP | 2010010637 A | 1/2010 |
| JP | 2010-041903 A | 2/2010 |
| JP | 4715340 B2 | 7/2011 |
| JP | 2011185697 A | 9/2011 |
| JP | 5060724 B2 | 10/2012 |
| JP | 2013-055769 A | 3/2013 |
| JP | 2013-520953 A | 6/2013 |
| JP | 6267562 B2 | 1/2018 |

* cited by examiner

TEMPERATURE CONTROLLING PROCESS

THERMOELECTRIC GENERATING DEVICE AND THERMOELECTRIC GENERATING METHOD

FIELD

The present invention relates to a thermoelectric generating device and a thermoelectric generating method capable of extending a life of a thermoelectric generating element with a simple configuration.

BACKGROUND

There conventionally is a thermoelectric generating device which converts thermal energy to electric energy by a thermoelectric generating element using the Seebeck effect. It becomes possible to recover a large amount of waste heat heretofore exhausted in factories, power plants, incinerators and the like as the electric energy by using the thermoelectric generating device. There is the thermoelectric generating device which outputs at a maximum power point or an optimal operating point based on voltage current characteristics of the thermoelectric generating element as disclosed in Patent Literatures 1 to 3, for example.

CITATION LIST

Patent Literatures

Patent Literature 1: Japanese Laid-open Patent Publication No. 2007-5371
Patent Literature 2: Japanese Laid-open Patent Publication No. 2010-41903
Patent Literature 3: Japanese Laid-open Patent Publication No. 2013-55769

SUMMARY

Technical Problem

When a load side is opened, current does not return to a thermoelectric generating element side, so that cooling of the thermoelectric generating element by the Peltier effect cannot be expected and the thermal energy from a heat source is continuously input to the thermoelectric generating element. As a result, there is a case in which hot side temperature of the thermoelectric generating element becomes higher than upper limit heat resistant temperature at which characteristic deterioration of the element occurs, so that the life of the thermoelectric generating element becomes problematically shorter.

Meanwhile, conventionally, in order to prevent the life of the element from shortening due to the temperature higher than heat resistant temperature, the thermoelectric generating element is physically kept away from a heat source to decrease the temperature of the thermoelectric generating element by natural heat radiation when the temperature becomes higher than the upper limit heat resistant temperature at which the characteristic deterioration of the element occurs. Therefore, the conventional thermoelectric generating device requires an additional mechanical structure for physically keeping the thermoelectric generating element away from the heat source, so that the device is forced to be complicated and large-sized.

The present invention is achieved in view of the above and an object thereof is to provide the thermoelectric generating device and the thermoelectric generating method capable of extending the life of the thermoelectric generating element by the simple configuration.

Solution to Problem

To solve the problem and achieve the object, a thermoelectric generating device according to the present invention that converts thermal energy to electric energy by using a thermoelectric generating element and outputs the electric energy includes: a temperature measuring unit configured to measure hot side temperature of the thermoelectric generating element; and a temperature controller configured to perform control to increase an amount of current returning to the thermoelectric generating element when the hot side temperature becomes higher than predetermined temperature.

Moreover, in the thermoelectric generating device according to the present invention further includes: an opening/closing switch that opens/closes between terminals of the thermoelectric generating element, wherein the temperature controller performs control to close the opening/closing switch when the hot side temperature becomes higher than the predetermined temperature.

Moreover, in the thermoelectric generating device according to the present invention further includes: a voltage converting circuit connected to the thermoelectric generating element that performs DC voltage conversion of the electric energy output from the thermoelectric generating element by using a switching element, wherein the temperature controller performs control to increase the amount of the current returning to the thermoelectric generating element when the hot side temperature becomes higher than the predetermined temperature by increasing a duty ratio of the switching element.

Moreover, in the thermoelectric generating device according to the present invention, the temperature controller further performs the control to increase the amount of the current returning to the thermoelectric generating element from startup of the device until the startup of the device is completed.

Moreover, in the thermoelectric generating device according to the present invention, the temperature measuring unit measures current output from the thermoelectric generating element and measures the hot side temperature based on relationship between the current and the hot side temperature.

Moreover, in the thermoelectric generating device according to the present invention, the temperature measuring unit measures voltage between terminals of the thermoelectric generating elements and measures the hot side temperature based on relationship between the voltage and the hot side temperature.

Moreover, in the thermoelectric generating device according to the present invention, the temperature measuring unit, the opening/closing switch, and the temperature controller form a reed switch which closes between terminals of the thermoelectric generating element when current output from the thermoelectric generating element becomes larger than a predetermined value corresponding to the hot side temperature.

Moreover, in the thermoelectric generating device according to the present invention, a bypass diode having diode characteristics allowing only a flow to a current output side of each thermoelectric generating element is connected in parallel to each of a plurality of thermoelectric generating elements.

Moreover, a method of converting thermal energy to electric energy by using a thermoelectric generating element and outputting the electric energy according to the present invention is a method of converting thermal energy to electric energy including: a temperature measuring step of measuring hot side temperature of the thermoelectric generating element; and a temperature controlling step of performing control to increase an amount of current returning to the thermoelectric generating element when the hot side temperature becomes higher than predetermined temperature.

According to the present invention, when the hot side temperature becomes higher than predetermined temperature, the temperature controller performs the control to increase the amount of the current returning to the thermoelectric generating element, so that the life of the thermoelectric generating element may be extended by the simple configuration.

DESCRIPTION OF EMBODIMENTS

A mode for carrying out the present invention is hereinafter described with reference to the attached drawings.

First Embodiment

[Entire Configuration]

Figure 1:
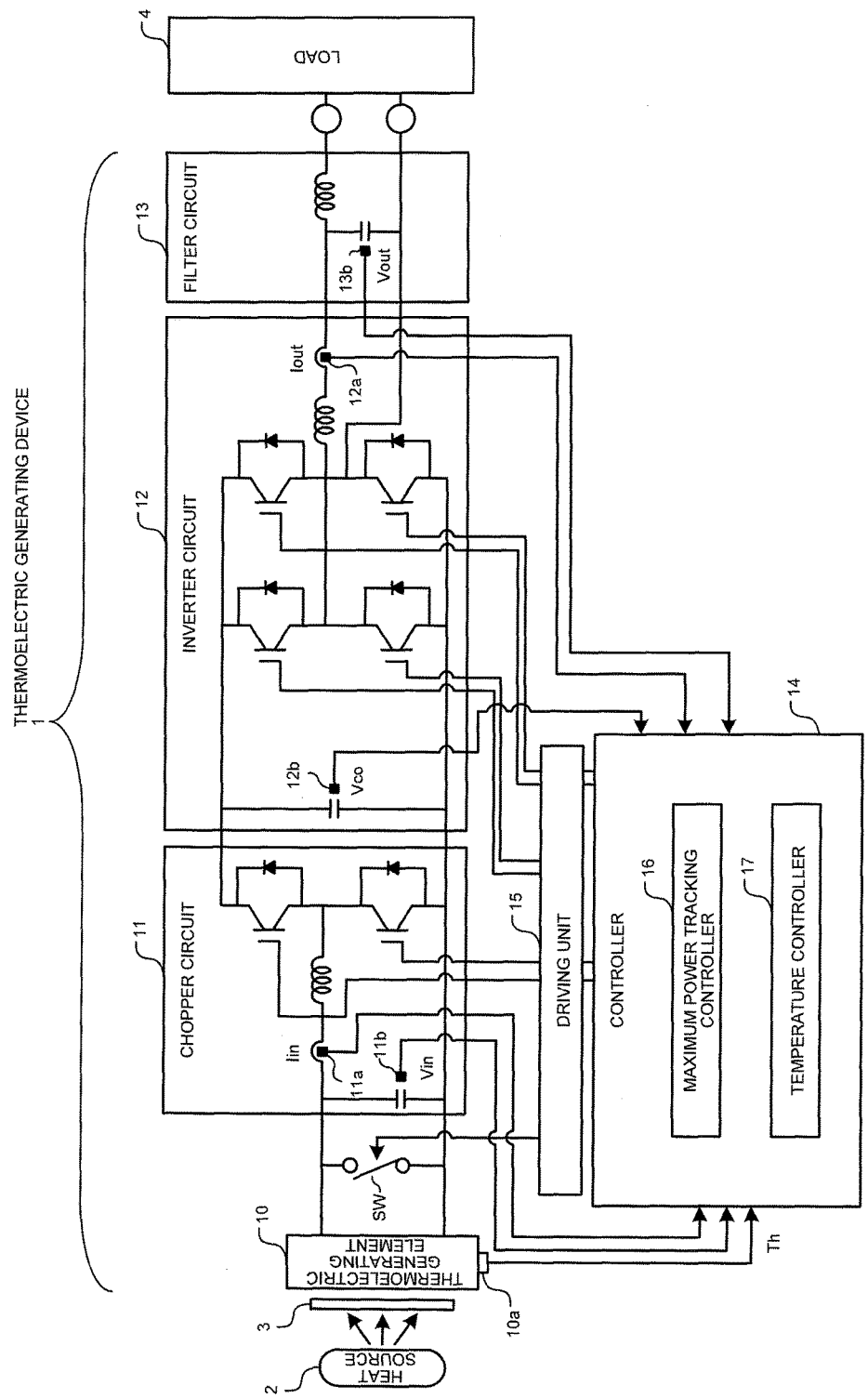
FIG. 1 is a block diagram illustrating a configuration of a thermoelectric generating device being a first embodiment of the present invention.

FIG. 1 is a block diagram illustrating a configuration of a thermoelectric generating device being a first embodiment of the present invention. As illustrated in FIG. 1, a thermoelectric generating device 1 includes a thermoelectric generating element 10. The thermoelectric generating element 10 formed of a BiTe thermoelectric material, for example, has output density of approximately 1 W/cm$^2$ with temperature difference between hot side temperature of 280 degrees C. and low temperature side temperature of 30 degrees C. A thermal conductor 3 which temporarily stores thermal energy supplied from a heat source 2 is connected to a high temperature side of the thermoelectric generating element 10 and the thermal energy is conducted to the thermoelectric generating element 10 through the thermal conductor 3.

Figure 2:
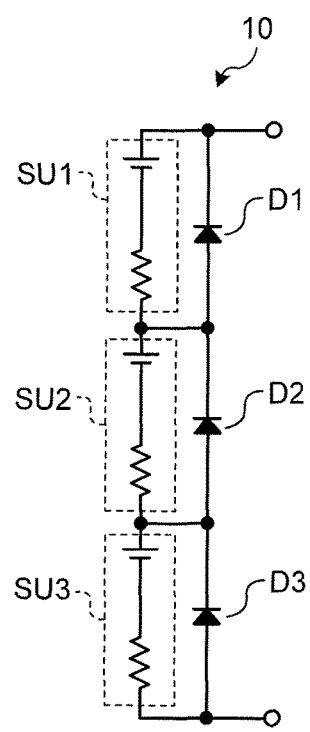
FIG. 2 is a circuit diagram illustrating a detailed configuration of the thermoelectric generating element illustrated in FIG. 1.

The thermoelectric generating element 10 in which a plurality of thermoelectric generating elements SU1 to SU3 is connected in series as illustrated in FIG. 2 outputs desired voltage. Bypass diodes D1 to D3 which allow energization only in a current output direction of the thermoelectric generating elements are connected in parallel to the thermoelectric generating elements SU1 to SU3, respectively. The bypass diodes D1 to D3 allow current to bypass when power generation capacity of the thermoelectric generating elements SU1 to SU3 connected in parallel thereto, respectively, is deteriorated or when the elements are damaged. For example, when the power generation capacity of the thermoelectric generating element SU2 is deteriorated or when the element is damaged, the thermoelectric generating element SU2 becomes resistance to consume electric energy output by other thermoelectric generating elements SU1 and SU3, so that the output current does not flow at worst. In this case, the electric energy output by the other thermoelectric generating elements SU1 and SU3 is output through the bypass diode D2. That is to say, even when the power generation capacity of the thermoelectric generating elements SU1 to SU3 is deteriorated or when the elements are damaged, it is possible to allow the current to bypass by the bypass diodes D1 to D3 and secure operation by the other sound thermoelectric generating elements SU1 to SU3.

An opening/closing switch SW is connected to both ends of the thermoelectric generating element 10; a chopper circuit 11, an inverter circuit 12, and a filter circuit 13 are sequentially connected on a subsequent stage thereof. As described later, the opening/closing switch SW is put into an on state when the hot side temperature of the thermoelectric generating element 10 becomes higher than upper limit predetermined temperature or from startup of the thermoelectric generating device 1 until the startup is completed, thereby allowing the current to return to the thermoelectric generating element 10 to decrease the temperature of the thermoelectric generating element 10 by the Peltier effect.

The chopper circuit 11 is a DC-DC converter which converts voltage supplied from the thermoelectric generating element 10 to desired voltage. The inverter circuit 12 is a DC-AC inverter which converts the DC voltage input from the chopper circuit 11 to AC voltage. The filter circuit 13 shapes a waveform of the AC voltage input from the inverter circuit 12 to a sine wave with an LC filter and outputs the same to a load 4 such as a motor. Meanwhile, the inverter circuit 12 illustrated in FIG. 1 generates two-phase AC voltage from the DC voltage.

A controller 14 performs on/off control of the opening/closing switch SW and switching elements in the chopper circuit 11 and the inverter circuit 12 through a driving unit 15 based on hot side temperature Th detected by a temperature sensor 10$a$, input current Iin detected by a current detecting sensor 11$a$ of the chopper circuit 11, input voltage Vin detected by a voltage detecting sensor 11$b$ of the chopper circuit 11, input voltage Vco detected by a voltage detecting sensor 12$b$ of the inverter circuit 12, output current Iout detected by a current detecting sensor 12$a$ of the inverter circuit 12, and output voltage Vout detected by a voltage detecting sensor 13$b$ of the filter circuit 13.

A maximum power tracking controller 16 in the controller 14 performs tracking control so as to operate at a maximum power point at which electromotive force output by the thermoelectric generating element 10 is maximum.

[Overview of Temperature Control] On the other hand, when hot side temperature Th detected by the temperature sensor 10a becomes higher than the upper limit predetermined temperature, a temperature controller 17 in the controller 14 performs control to turn on the opening/closing switch SW. Specifically, this turns on the opening/closing switch SW after the temperature becomes higher than upper limit predetermined temperature Ta until this reaches lower limit predetermined temperature Tc.

Figure 3:
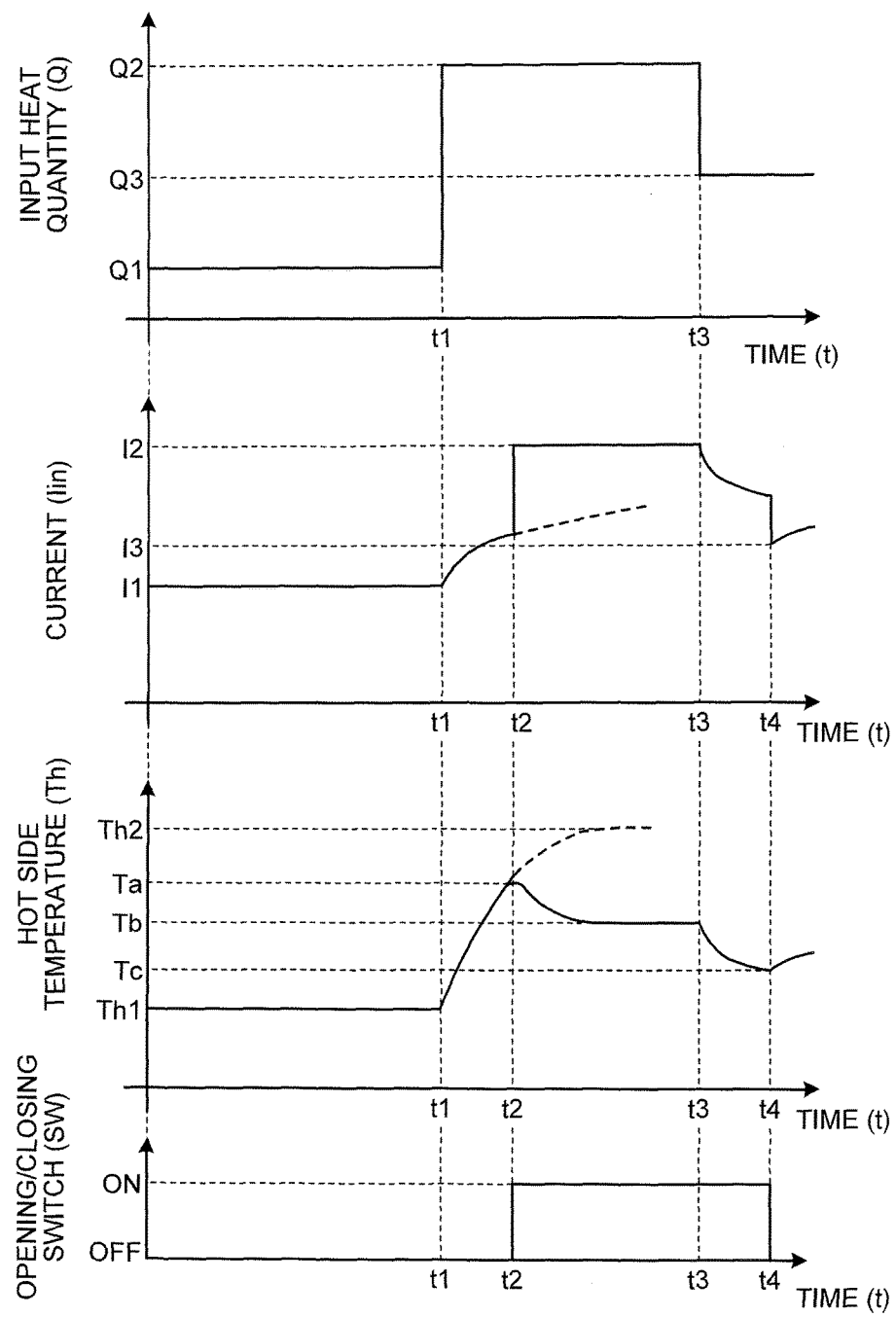
FIG. 3 is a time chart illustrating an example of a temperature controlling process by a temperature controller illustrated in FIG. 1.

As illustrated in FIG. 3, input heat quantity Q is constant at value Q1 until time point t1, and current Iin during this is constant current at value Ii. Hot side temperature Th at that time is also maintained at constant hot side temperature Th1. Hot side temperature Th1 is not higher than upper limit predetermined temperature Ta, so that the opening/closing switch SW is in an off state until time point t1.

When input heat quantity Q increases from value Q1 to value Q2 at time point t1, current Iin and hot side temperature Th also increase as input heat quantity Q increases. Herein, when hot side temperature Th becomes higher than upper limit predetermined temperature Ta at time point t2, the temperature controller 17 turns on the opening/closing switch SW in priority to the control of the maximum power tracking controller 16. According to this, current Iin increases to current I2 at once by return current through the opening/closing switch SW and the Peltier effect in the thermoelectric generating element 10 also increases at once by the increase in current Iin, so that hot side temperature Th gradually decreases. Then, hot side temperature Th becomes constant at temperature Tb. In FIG. 3, the opening/closing switch SW is maintained in the on state also at time t3.

Thereafter, when input heat quantity Q decreases from value Q2 to value Q3 at time point t3, current Iin and hot side temperature Th also gradually decrease. When hot side temperature Th reaches lower limit predetermined temperature Tc or lower at time point t4, the temperature controller 17 turns off the opening/closing switch SW.

In this manner, the temperature controller 17 performs the control to turn on the opening/closing switch SW when hot side temperature Th becomes higher than upper limit predetermined temperature Ta and thereafter turn off the opening/closing switch SW when the temperature reaches lower limit predetermined temperature Tc or lower.

In this first embodiment, the temperature controller 17 performs the above-described temperature control, thereby preventing the temperature of the thermoelectric generating element 10 from becoming higher than upper limit heat resistant temperature at which characteristic deterioration occurs, for example, hot side temperature Th2 illustrated in FIG. 3, so that a life of the thermoelectric generating element 10 may be made longer by a simple configuration.

Meanwhile, the temperature control by the temperature controller 17 described above is performed on the assumption that the thermoelectric generating device 1 is in a stably operating state after the startup. From the startup of the thermoelectric generating device 1 until the startup is completed, the switching elements of the chopper circuit 11 and the inverter circuit 12 are in the off state and the circuit on the chopper circuit 11 side as seen from the thermoelectric generating element 10 is opened. At that time, when there is input heat quantity Q to the thermoelectric generating element 10, since the circuit on the chopper circuit 11 side is opened and there is no return current to the thermoelectric generating element 10, the Peltier effect does not occur in the thermoelectric generating element 10, the thermoelectric generating element 10 is not cooled, and the temperature continuously increases. In this case, the temperature controller 17 is also being started, there is a case in which hot side temperature Th becomes higher than upper limit predetermined temperature Ta before the startup is completed if input heat quantity Q is significantly large.

Figure 4:
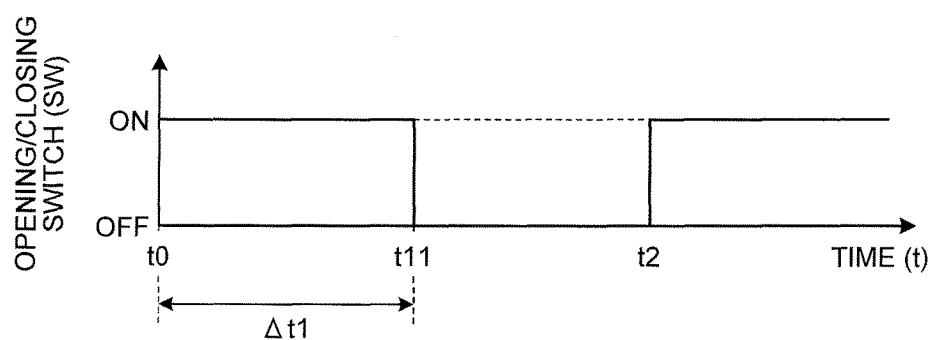
FIG. 4 is a time chart illustrating opening/closing control of an opening/closing switch from startup until the startup is completed.

Therefore, in this first embodiment, the temperature controller 17 performs control to turn on the opening/closing switch SW from the startup until the startup is completed. That is to say, as illustrated in FIG. 4, this turns on the opening/closing switch SW from time point t0 of the startup until time point t11 at which the startup is completed (Δt1). Thereafter, after time point t11, the controller 14 turns off the opening/closing switch SW for turning on/off the switching elements of the chopper circuit 11 and the inverter circuit 12. When hot side temperature Th becomes higher than upper limit predetermined temperature Ta at time point t2, the opening/closing switch SW is turned on. Specifically, the temperature controller 17 turns on the opening/closing switch SW after a power source is turned off and maintains this state.

[Temperature Controlling Process]

Figure 5:
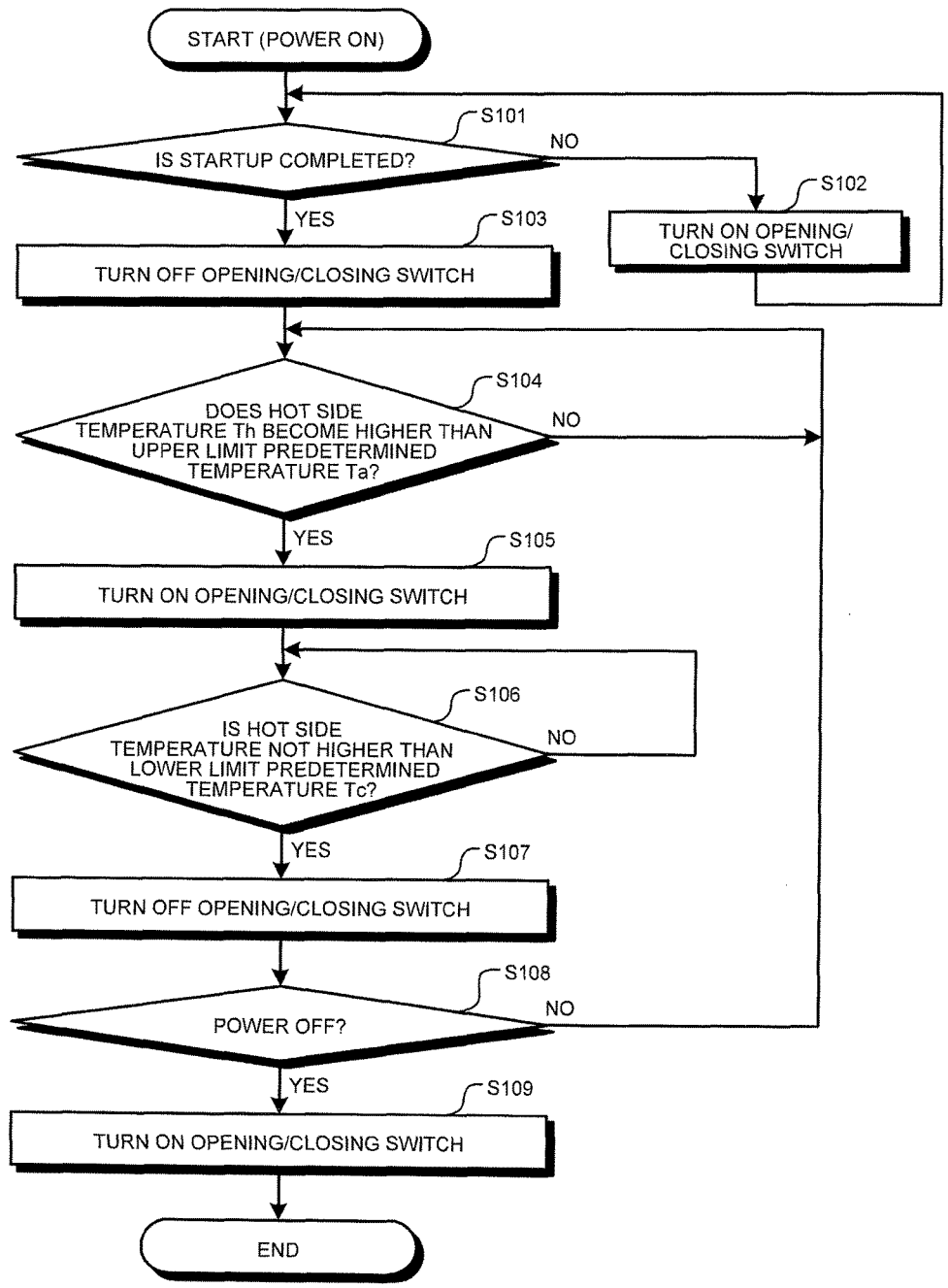
FIG. 5 is a flowchart illustrating a temperature controlling procedure by the temperature controller.

Herein, a temperature controlling process by the temperature controller 17 is described with reference to the flowchart illustrated in FIG. 5. As illustrated in FIG. 5, the controller 14 is turned on and the temperature controller 17 first determines whether the startup is completed (step S101). When the startup is not completed (step S101, No), this maintains the opening/closing switch SW in the on state (step S102) and repeatedly performs the determining process at step S101. On the other hand, when the startup is completed (step S101, Yes), this turns off the opening/closing switch SW (step S103).

Thereafter, this determines whether hot side temperature Th detected by the temperature sensor 10a becomes higher than upper limit predetermined temperature Ta (step S104). When hot side temperature Th does not become higher than upper limit predetermined temperature Ta (step S104, No), this repeats the determining process at step S104. On the other hand, when hot side temperature Th becomes higher than upper limit predetermined temperature Ta (step S104, Yes), this turns on the opening/closing switch SW (step S105) to increase the return current to the thermoelectric generating element 10, thereby cooling the thermoelectric generating element 10 by the Peltier effect.

Thereafter, this determines whether hot side temperature Th reaches lower limit predetermined temperature Tc or lower (step S106). When hot side temperature Th does not reach lower limit predetermined temperature Tc or lower (step S106, No), this repeats the determining process at step S106. On the other hand, when hot side temperature Th reaches lower limit predetermined temperature Tc or lower (step S106, Yes), this turns off the opening/closing switch SW (step S107) to decrease the return current to the thermoelectric generating element 10, thereby inhibiting the cooling of the thermoelectric generating element 10 by the Peltier effect and allows the maximum power tracking controller 16 to perform effective maximum power tracking control.

Thereafter, this determines whether the power source is turned off (step S108). When the power source is not turned off (step S108, No), this shifts to step S104 and performs the above-described temperature controlling process at stationary time. On the other hand, when the power source is turned off (step S108, Yes), this turns on the opening/closing switch SW (step S109) and finishes this procedure. Since the opening/closing switch SW is turned on at step S109, the opening/closing switch SW is maintained in the on state at next startup.

[Alternative to Temperature Sensor]

Figure 6:
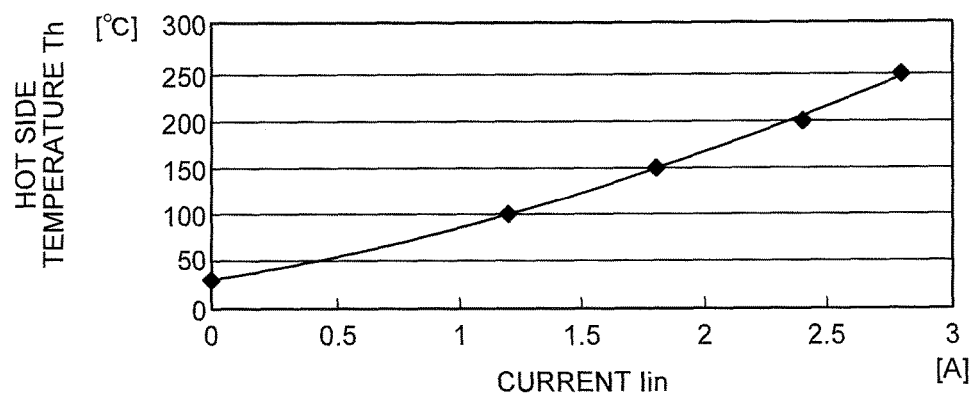
FIG. 6 is a view illustrating relationship between hot side temperature and current.

Meanwhile, in the above-described first embodiment, the temperature controller 17 performs the on/off control of the opening/closing switch SW based on hot side temperature Th detected by the temperature sensor 10a. Herein, as illustrated in FIG. 6, hot side temperature Th has linear relationship with current Iin. Therefore, it is possible to know hot side temperature Th by measuring current Iin based on this relationship. Therefore, in this case, it is possible to obtain hot side temperature Th by measuring input current Iin detected by the current detecting sensor 11a without providing the temperature sensor 10a.

Figure 7:
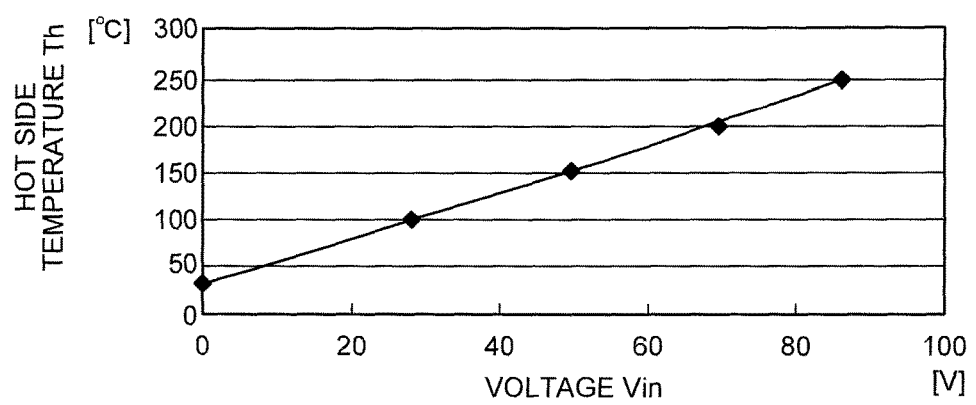
FIG. 7 is a view illustrating relationship between the hot side temperature and voltage.

Similarly, as illustrated in FIG. 7, hot side temperature Th has linear relationship with voltage Vin. Therefore, it is possible to know hot side temperature Th by measuring voltage Vin based on this relationship. Therefore, in this case, it is possible to obtain hot side temperature Th by measuring input voltage Vin detected by the voltage detecting sensor 11b without providing the temperature sensor 10a.

Figure 8:
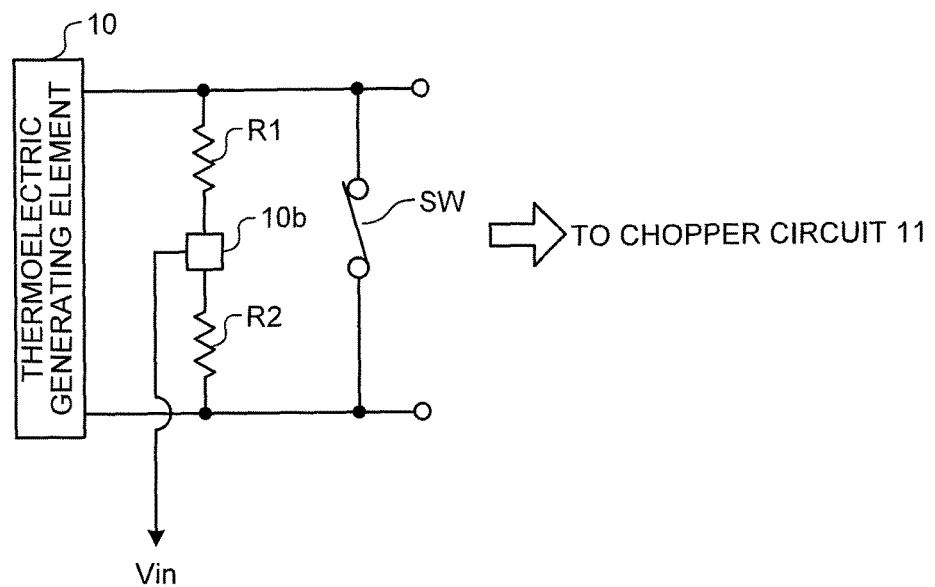
FIG. 8 is a view illustrating an example of a circuit which measures voltage between terminals of the thermoelectric generating element.

Meanwhile, it is also possible to directly measure voltage Vin by using a voltmeter 10b as illustrated in FIG. 8 in place of measuring input voltage Vin by the voltage detecting sensor 11b. In this case, it is preferable to set resistance R1 to a large value such as several hundred kΩ and set resistance R2 to a small value such as several kΩ to divide voltage and step down the voltage in a position of the voltmeter 10b to measure.

Although switching control with hysteresis characteristics to turn on the opening/closing switch SW until the temperature reaches lower limit predetermined temperature Tc after becoming higher than upper limit predetermined temperature Ta is performed to prevent chattering of the opening/closing switch SW in the above-described first embodiment, there is no limitation; the temperature control may be such that the opening/closing switch SW is turned on only when the temperature becomes higher than upper limit predetermined temperature Ta.

Second Embodiment

In the above-described first embodiment, the temperature controller 17 performs the opening/closing control of the opening/closing switch SW based on hot side temperature Th detected by the temperature sensor 10a. On the other hand, in this second embodiment, a reed switch SW1 obtained by integrating a temperature sensor 10a, a temperature controller 17, and an opening/closing switch SW is used.

Figure 9:
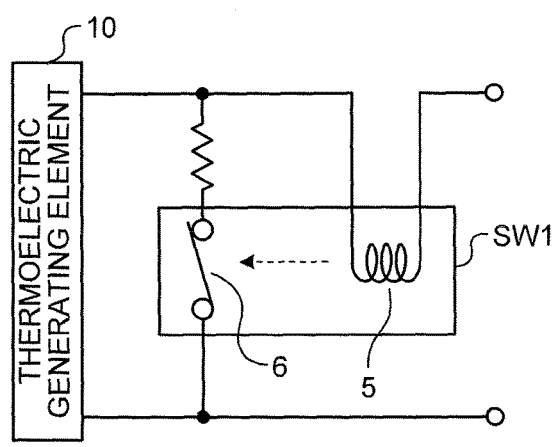
FIG. 9 is a view illustrating a configuration of a reed switch being a second embodiment of the present invention.

As illustrated in FIG. 9, the reed switch SW1 turns on a switch 6 when a magnetic field according to strength of current flowing to a coil 5 becomes larger than a predetermined value. The value of the current flowing to the coil 5 when the switch 6 is turned on may be the current value corresponding to upper limit predetermined temperature Ta in the first embodiment as illustrated in FIG. 6. Meanwhile, temperature control in this case is such that the reed switch SW1 is turned on only when the temperature becomes higher than upper limit predetermined temperature Ta.

Third Embodiment

Figure 10:
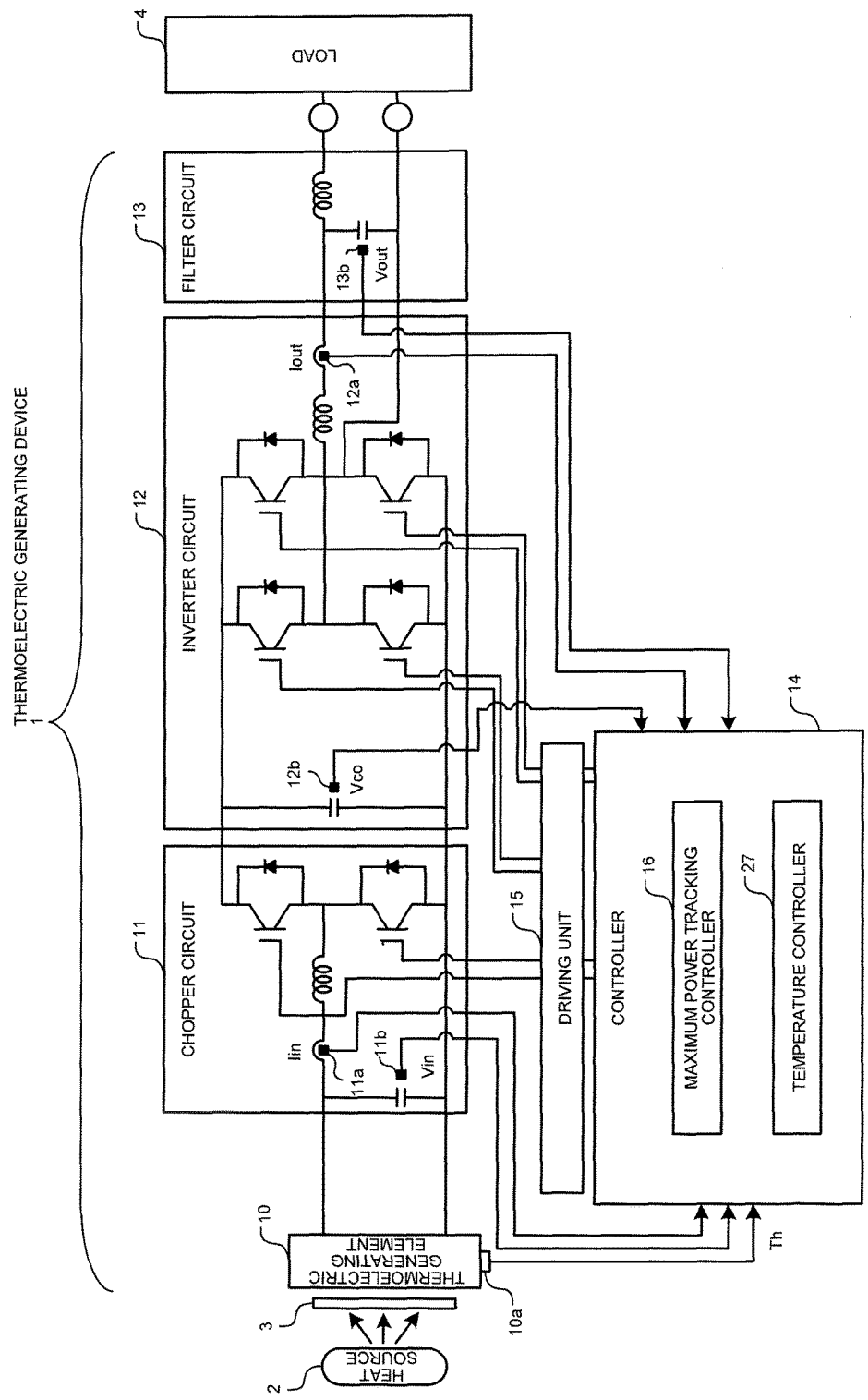
FIG. 10 is a block diagram illustrating a configuration of a thermoelectric generating device being a third embodiment of the present invention.

In the above-described first embodiment, the temperature control of the thermoelectric generating element 10 is performed by controlling increase/decrease in the return current to the thermoelectric generating element 10 by using the opening/closing switch SW. On the other hand, in this third embodiment, an opening/closing switch SW is not used as illustrated in FIG. 10; a temperature controller 27 makes duty ratios of switching elements of a chopper circuit 11 and an inverter circuit 12 larger than the duty ratios at the time of normal control by a maximum power tracking controller 16 when hot side temperature Th detected by a temperature sensor 10a becomes higher than upper limit predetermined temperature Ta, thereby increasing return current to a thermoelectric generating element 10 to cool the thermoelectric generating element 10. That is to say, in the third embodiment, the cooling of the thermoelectric generating element 10 is included in PWM (pulse width modulation) control of the switching elements of the chopper circuit 11 and the inverter circuit 12.

It is preferable to set each switching element in a conductive state or to have a larger duty ratio from startup until the startup is completed.

Meanwhile, although the device which uses an AC power source is the load 4 and the inverter circuit 12 and the filter circuit 13 are provided in the above-described first to third embodiments, there is no limitation; the device which uses a DC power source may be the load 4. In this case, the inverter circuit 12 and the filter circuit 13 are not required. In this case, the load 4 may also be a storage battery.

In other words, the circuit on a load 4 side as seen from the thermoelectric generating element 10 is always closed from the startup until the startup is completed and during the stationary operation in the first to third embodiments. That is to say, the increase in the temperature of the thermoelectric generating element 10 beyond upper limit predetermined temperature Ta due to the open circuit is prevented.

REFERENCE SIGNS LIST

1 THERMOELECTRIC GENERATING DEVICE
2 HEAT SOURCE
3 THERMAL CONDUCTOR
4 LOAD
5 COIL
6 SWITCH
10 THERMOELECTRIC GENERATING ELEMENT
10a TEMPERATURE SENSOR
10b VOLTMETER
11 CHOPPER CIRCUIT
11a, 12a CURRENT DETECTING SENSOR
11b, 12b, 13b VOLTAGE DETECTING SENSOR
12 INVERTER CIRCUIT
13 FILTER CIRCUIT
14 CONTROLLER
15 DRIVING UNIT
16 MAXIMUM POWER TRACKING CONTROLLER
17, 27 TEMPERATURE CONTROLLER
D1 to D3 BYPASS DIODE
Iin CURRENT
Vin VOLTAGE
R1, R2 RESISTANCE
SW OPENING/CLOSING SWITCH
SW1 REED SWITCH
Ta UPPER LIMIT PREDETERMINED TEMPERATURE
Tc LOWER LIMIT PREDETERMINED TEMPERATURE
Th HOT SIDE TEMPERATURE

The invention claimed is:

1. A thermoelectric generating device comprising:
    a thermoelectric generating element configured to convert thermal energy to electric energy and to output the electric energy;
    a temperature measuring unit configured to measure hot side temperature of the thermoelectric generating element;
    a temperature controller configured to perform control to increase an amount of current returning to the thermoelectric generating element when the hot side temperature becomes higher than predetermined temperature; and
    an opening/closing switch connected to each end of the thermoelectric generating element, wherein the opening/closing switch is configured to open/close between the ends of the thermoelectric generating element,
    wherein the temperature controller controls the opening/closing switch to close the opening/closing switch when the hot side temperature becomes higher than the predetermined temperature to allow current to return to the thermoelectric generating element.

2. The thermoelectric generating device according to claim 1, comprising:
    a voltage converting circuit connected to the thermoelectric generating element that performs DC voltage conversion of the electric energy output from the thermoelectric generating element by using a switching element, wherein
    the temperature controller performs control to increase the amount of the current returning to the thermoelectric generating element when the hot side temperature becomes higher than the predetermined temperature by increasing a duty ratio of the switching element.

3. The thermoelectric generating device according to claim 1, wherein the temperature controller further performs the control to increase the amount of the current returning to the thermoelectric generating element from startup of the device until the startup of the device is completed.

4. The thermoelectric generating device according to claim 1, wherein the temperature measuring unit measures current output from the thermoelectric generating element and measures the hot side temperature based on relationship between the current and the hot side temperature.

5. The thermoelectric generating device according to claim 1, wherein the temperature measuring unit measures voltage between terminals of the thermoelectric generating elements and measures the hot side temperature based on relationship between the voltage and the hot side temperature.

6. The thermoelectric generating device according to claim 1, wherein the temperature measuring unit, the opening/closing switch, and the temperature controller form a reed switch which closes between terminals of the thermoelectric generating element when current output from the thermoelectric generating element becomes larger than a predetermined value corresponding to the hot side temperature.

7. The thermoelectric generating device according to claim 1, wherein a bypass diode having diode characteristics allowing only a flow to a current output side of each thermoelectric generating element is connected in parallel to each of a plurality of thermoelectric generating elements.

8. A thermoelectric generating method of converting thermal energy to electric energy by using a thermoelectric generating element and outputting the electric energy, comprising:
    measuring hot side temperature of the thermoelectric generating element; and
    increasing an amount of current returning to the thermoelectric generating element when the hot side temperature becomes higher than predetermined temperature by controlling an opening/closing switch connected to each end of the thermoelectric generating element to close the opening/closing switch when the hot side temperature becomes higher than the predetermined temperature to allow current to return to the thermoelectric generating element.

9. A thermoelectric generating device comprising:
    a thermoelectric generating element configured to convert thermal energy to electric energy and to output the electric energy;
    a temperature measuring unit configured to measure hot side temperature of the thermoelectric generating element; and
    a temperature controller configured to perform control to increase an amount of current returning to the thermoelectric generating element when the hot side temperature becomes higher than predetermined temperature,
    wherein the temperature controller further performs the control to increase the amount of the current returning to the thermoelectric generating element from startup of the device until the startup of the device is completed.

* * * * *